United States Patent [19]

Nagano et al.

[11] Patent Number: 5,443,900
[45] Date of Patent: Aug. 22, 1995

[54] ELECTROMAGNETIC WAVE ABSORBER

[75] Inventors: Toshiaki Nagano; Heihachi Murase; Hideo Kogure, all of Hiratsuka, Japan

[73] Assignee: Kansai Paint Co., Ltd., Amagasaki, Japan

[21] Appl. No.: 115,252

[22] Filed: Sep. 1, 1993

Related U.S. Application Data

[63] Continuation of Ser. No. 757,276, Sep. 10, 1991, abandoned.

[51] Int. Cl.⁶ .................... B32B 5/16; H05K 9/00
[52] U.S. Cl. .................... 428/332; 428/336; 428/457; 428/458; 428/461; 428/463; 428/621; 428/624; 428/625; 428/626; 174/35 R; 174/35 C; 174/35 GC; 174/35 SM; 174/35 CE; 174/35 MS
[58] Field of Search ............ 428/458, 461, 463, 621, 428/624, 625, 626, 920, 921, 332, 336, 457; 174/35 R, 35 C, 35 GC, 35 SM, 35 CE, 35 MS

[56] References Cited

U.S. PATENT DOCUMENTS

| | | | |
|---|---|---|---|
| 4,662,288 | 5/1987 | Mastings et al. | 428/251 |
| 4,749,625 | 6/1988 | Obayashi et al. | 428/461 |
| 4,910,090 | 3/1990 | Kuhlman et al. | 428/469 |
| 4,965,408 | 10/1990 | Chapman et al. | 174/35 MS |
| 4,978,812 | 12/1990 | Akeyoshi et al. | 174/35 MS |
| 4,980,223 | 12/1990 | Nakano et al. | 428/198 |
| 5,045,637 | 9/1991 | Sato | 174/35 MS |
| 5,178,722 | 1/1993 | Hoshino | 156/630 |
| 5,244,708 | 9/1993 | Tsuchida | 428/77 |
| 5,270,493 | 12/1993 | Inoue | 174/253 |

*Primary Examiner*—L. Kiliman
*Attorney, Agent, or Firm*—Fisher, Christen & Sabol

[57] ABSTRACT

An electromagnetic wave absorber comprising at least one of a unit film as a multilayered film comprising a resin layer (A) optionally containing a pigment and a layer (B) applied onto the resin layer (A), selected from a group consisting of a metal layer, an alloy layer and a partly oxidized layer of the metal layer or the alloy layer, and having a film thickness of 1 nm to 50 nm.

2 Claims, 3 Drawing Sheets

ELECTROMAGNETIC WAVE ABSORBER

This application is a continuation of prior U.S. application Ser. No. 07/757,276, filed Sep. 10, 1991, now abandoned.

BACKGROUND OF THE INVENTION

1. Field of the Invention

This invention relates to an electromagnetic wave absorber which is capable of being lighter so as to save weight and being made a thin-gage film.

2. Description of the Prior Art

There are known electromagnetic wave absorbent materials which are prepared by dispersing ferrite or a mixture of ferrite with metal powder or carbon powder into an organic polymer.

However, it is necessary for the above electromagnetic wave absorbent material to be of a satisfactorily thick film because it shows such a poor electromagnetic wave absorbing power as to be impracticable unless it has a film thickness of at least 1 mm or more and of at least 4.5 mm or more when electromagnetic waves which have a broad frequency range are absorbed. Therefore, in use, the above electromagnetic wave absorbent material has disadvantages because it is so heavy in weight as to show poor application and working properties. There is a great demand to develop an electromagnetic wave absorber which is of a thin-gage film and is lighter so as to save weight and so as to show good application and working properties, and has improved electromagnetic wave absorbing power.

SUMMARY OF THE INVENTION

It is an object of the present invention to provide an electromagnetic wave absorber which has such an improved electromagnetic wave absorbing power because it is a thin-gage film and is lighter so as to save weight and good application and working properties.

That is, the present invention provides an electromagnetic wave absorber which comprises at least one of a unit film as a multilayered film which comprises a resin layer (A) which optionally contains a pigment and a layer (B) applied onto the resin layer (A), selected from a group which consists of a metal layer, an alloy layer and a partly oxidized layer of the metal layer or the alloy layer, and which has a film thickness of 1 nm to 50 nm.

DETAILED DESCRIPTION OF THE INVENTION

Figure 1:
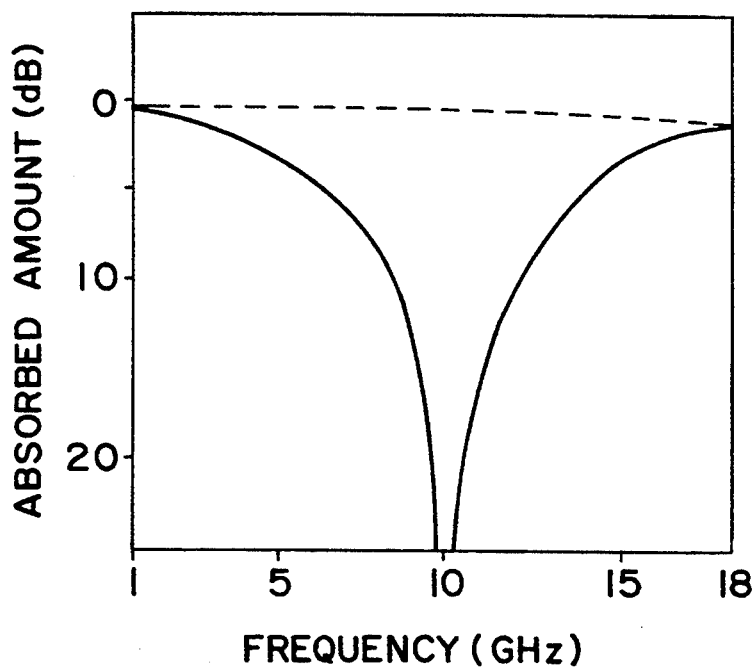
FIG. 1 shows graphs of electromagnetic wave absorption curves of the electromagnetic wave absorbers obtained in Example 1 and Comparative Example 1 respectively, in which the solid line shows the electromagnetic wave absorption curve in Example 1, and the broken line shows the electromagnetic wave absorption curve in Comparative Example 1.

The layer (A) used in the present invention is a resin layer which may optionally contain a pigment, and is obtained either by molding in the form of a sheet or by coating and drying the resin itself or the pigment-dispersed resin on a substrate. Examples of the above resin may include polyimide, polyphenylene sulfide, rosin, shellac, ester rubber, Hypalon (chlorosulfonated polyethylene, trade name) rubber, chlorinated rubber, chloroprene rubber, vinyl chloride resin, polyester resin, alkyd resin, phenolic resin, epoxy resin, acrylic resin, urethane resin, silicone resin, cellulose resin, vinyl acetate resin, and the like.

Examples of the above pigment, which may optionally be dispersed in the above resin, may include magnetic metal powder, for example, iron powder such as ferrite,.electrolytic iron, iron carbonyl, reduced iron and the like, nickel powder such as electrolytic nickel, nickel carbonyl and the like, cobalt powder such as electrolytic cobalt, reduced cobalt, cobalt carbonyl and the like, etc.; color pigments such as titanium white, red iron oxide, chrome yellow, titanium yellow, carbon black, phthalocyanine green, organic red pigments, phthalocyanine blue and the like; filler such as silica, talc, clay, calcium carbonate, baryta and the like; copper powder, brass powder, and the like. At least one thereof may be formulated and dispersed, and, if needed, additives such as organic solvents, dispersants, etc. may also be incorporated thereinto.

Examples of the above substrate, onto which the above layer (A) may be formed, used in the present invention may include plastic sheets such as those of polyimide, polyethylene terephthalate (PET), polyphenylene sulfide, polyvinyl chloride and the like; metals such as brass, copper, iron, stainless steel, aluminum and the like.

The film thickness of the layer (A) used in the present invention may arbitrarily be selected depending on the frequency of the electromagnetic wave to be absorbed, and is preferably in the range of 1 $\mu$m to 1 mm. When less than 1 $\mu$m, the power of the electromagnetic wave loss may become unsatisfactory, and on the other hand, when more than 1 mm and as it becomes thick, it may become heavy in weight, which results in poor application and working properties. The layer (A) may be a multilayered construction such as a bilayer which consists of a clear resin layer and a pigment-containing resin layer, and the like.

The layer (B) formed onto the above layer (A) in the present invention is one selected from a group which consists of a metal layer, an alloy layer and a partly oxidized layer of the metal layer or the alloy layer.

Examples of the metal which constitutes the above metal layer may include metals such as nickel, copper, silver, gold, tungsten, iron, cobalt, zinc, aluminum, chromium, tin, magnesium, manganese, and the like.

Examples of the alloy which constitute the above alloy layer may include alloys such as terbium-iron-cobalt alloy (Tb-Fe-Co), iron-nickel alloy (Fe-Ni), manganese-copper-bismuth alloy (Mn-Cu-Bi), gadlinium-terbium-iron alloy (Gd-Tb-Fe), gadlinium-iron-bismuth alloy (Gd-Fe-Bi), gadlinium-iron-cobalt (Gd-Fe-Co), platinum-cobalt alloy (Pt-Co), dysprosium-iron alloy (Dy-Fe), and the like. Of these, nickel, iron, copper, silver, and terbium-iron-cobalt alloy are preferred.

The metal layer or the alloy layer which constitute the layer (B) may be formed onto the layer (A) by means of vapor deposition, sputtering, electroless plating, ion plating, etc. The electromagnetic wave absorber which comprise the layer (A) and the layer (B) formed onto a substrate, may be separated from the substrate to obtain a free film.

The layer (B) in the present invention may also be a partly oxidized layer of the metal layer or the alloy layer. Examples of the method of forming the partly oxidized layer may include a method of heating a multilayered film which comprise the layer (A) and the metal layer or the alloy layer and a method of laminating the above multilayered film, followed by heating. The above heating is carried out in the presence of oxygen, for example, in the air, and the metal layer or the alloy layer is thereby partly oxidized. The heating conditions may arbitrarily be selected depending on the kind of the metal or the alloy, etc., but are normally at 50° to 200° C. for 30 minutes to 5 hours. The above heating is carried out, if needed, so that the impedance of the multilayered film which comprises the layer (A) and the layer (B) or of the electromagnetic wave absorber as a laminate of the multilayered film may be matched with the impedance of the electromagnetic wave to be absorbed by partly oxidizing the metal layer or the alloy layer.

In the present invention, it is considered that the layer (B) formed onto the resin layer (A) functions as a kind of half mirror. That is, the electromagnetic waves which reach the layer (B) from the outside, namely through the environmental air mostly penetrate through the layer (B), and the electromagnetic waves, which have penetrated through the layer (B) attenuate as they are penetrating through the layer (A) and reach the back surface of the layer (A) to be all or partly reflected thereon. The electromagnetic waves which have been reflected onto the back surface of the layer (A), penetrate through the layer (A) as they are being attenuated to reach an interface between the layer (A) and the layer (B). And it is considered that the layer (B) may function as a kind of half mirror on the interface between the layers (A) and (B) so that the electromagnetic waves which have penetrated through the layer (A) are all or partly reflected on the above interface, which is followed by repeating the above steps, namely by multiple reciprocation of electromagnetic waves through the layer (A) with the result that waves are effectively attenuated and absorbed.

The film thickness of the layer (B) may appropriately be defined depending on the kind thereof, but is normally 1 to 50 nm, preferably 1 to 30 nm. When the film thickness of the layer (B) is less than 1 nm or more than 50 nm, it becomes impossible to obtain material characteristics necessary for electromagnetic wave absorption.

The electromagnetic wave absorber in the present invention may consist of only one of a unit film as a multilayered film which comprises the resin layer (A) and the layer (B), or may consist of two or more of the unit film as the multilayered film. The electromagnetic wave absorber which consists of two or more of the unit film may be formed by laminating the unit film, for example, by a method of successively adhering each to the other with an adhesive, etc. Examples of the method of adhering with the adhesive may include a method of coating the adhesive by use of a bar coater, roll, etc. on the surfaces to be laminated; a method of separating a release paper which covers an adhesive layer from the adhesive layer and adhering the film with the adhesive layer so that each unit film may be laminated to each other, and the like.

The formation of an electromagnetic wave absorber which comprises a plurality of unit films results in increasing the wave absorbing power compared with that which comprises a single unit film. That is, the unit film may have a preferable film thickness depending on such characteristics as the frequency of the electromagnetic wave to be absorbed, but generally in the case where the overall film thickness and the material of the layer (A) are identical to each other, an electromagnetic wave absorber which is formed by laminating a plurality of thinner unit films shows an increased wave absorbing power compared with that which comprises a thicker single unit film. This may be because the dielectric constant in the former is generally increased compared with that in the latter.

The electromagnetic wave absorber of the present invention may have at least one of a unit film which comprises a multilayered film. In the case where a plurality of unit films are laminated, unit films identical in kind to each other or unit films which have a thickness equal to each other may be laminated, and different kinds of unit films and unit films different in thickness may also be laminated. Since the increase in the number of the laminated unit films makes it possible to shift a frequency of the electromagnetic wave to be absorbed to a low frequency side, the number of the laminated unit films may be varied depending on an intended frequency.

The electromagnetic wave absorber of the present invention may be composed of at least one of the unit film which consists of the multilayered film only, and may be formed onto a substrate to which electromagnetic wave absorption is intended, for example, a metal structure. The electromagnetic wave absorber of the present invention may be formed onto a thin metallic sheet or onto a plastic film laminated on the thin metallic sheet.

For the purpose of the improvement of the electromagnetic wave absorber in weather resistance, appearance, maintenance of material characteristics, etc., a clear or colored coated film layer as an uppermost layer of the electromagnetic wave absorber may be formed by coating, etc. Examples of the resin used for forming the coated film layer may include urethane resin, acrylic resin, polyester resin, and the like.

In use of the electromagnetic wave absorber of the present invention, the electromagnetic wave absorber may be adhered onto a substrate to which the electromagnetic wave absorption is intended by use of an adhering agent such as an adhesive. An adhering agent may be coated beforehand on an opposite side to the layer (B) of the electromagnetic wave absorber, a release sheet may be laminated thereon, and the release sheet may then be separated for simply adhering to the substrate in situ to form an electromagnetic wave absorber onto the substrate.

The electromagnetic wave absorber of the present invention has such a highly improved electromagnetic wave absorbing power compared with that in the prior art under the condition of the same film thickness that the electromagnetic wave absorber of the present invention is capable of being made a thin-gage film, being lighter so as to save weight, and is improved in application and working properties. Since the electromagnetic wave absorber of the present invention is in the form of a film, it may be wound up in the form of a coil, as the case may be.

The present invention will be explained more in detail by the following Examples and Comparative Example, in which "part" means "part by weight".

EXAMPLE 1

Into an epoxy resin solution was incorporated and dispersed 30 parts of a barium-containing ferrite per 100 parts of the resin solid content to obtain a barium ferrite coating material, which was then coated onto a brass sheet having a thickness of 10 mm to be a dry film thickness of 90 μm, and was dried to obtain a barium ferrite coating material layer. Thereafter a terbium-iron-cobalt alloy was applied onto the barium ferrite layer to a thickness of 25 nm by sputtering to form a terbium-iron-cobalt alloy layer. Thereafter onto the above alloy layer, 9 units of a multilayered film consisting of a 90 μm barium ferrite coating material layer and a 25 nm terbium-iron-cobalt alloy layer as one unit were successively laminated to obtain an intended electromagnetic wave absorber having a total film thickness of about 900 μm and consisting of 10 units of the multilayered film as one unit on the above brass sheet.

EXAMPLE 2

Nickel was deposited by vapor deposition to a thickness of 20 nm onto a polyimide film having a thickness of 50 μm, followed by heating at 200° C. for one hour to obtain a heat-treated multilayered film, which was successively laminated to obtain a laminate consisting of 10 heat-treated multilayered films.

Into an urethane resin solution was incorporated and dispersed 120 parts of a barium-containing ferrite per 100 parts of the resin solid content to obtain a barium ferrite coating material, which was then coated onto a brass sheet having a thickness of 10 mm to a dry film thickness of 400 μm, and was dried to obtain a barium ferrite coating material layer, onto which the above laminate was adhered to obtain an intended electromagnetic wave absorber having a thickness of about 900 μm on the brass sheet having a thickness of 10 mm.

EXAMPLE 3

Onto a polyethylene terephthalate film having a thickness of 50 μm was deposited silver by vapor deposition to a film thickness of 20 nm to obtain a unit film, which was then successively laminated to obtain a laminate consisting of 10 unit films. Thereafter, onto the uppermost silver film layer of the above laminate was coated and dried a room temperature curing acrylic-urethane resin clear coating composition to a dry film thickness of about 100 μm, followed by being adhered onto a brass sheet having a thickness of 10 mm so that the surface of the polyethylene terephthalate film layer may face thereto to obtain an intended electromagnetic wave absorber having a thickness of about 600 μm on the brass sheet.

EXAMPLE 4

Onto a ferrite-dispersed epoxy resin film containing 30% by weight of ferrite and having a thickness of 100 μm was deposited nickel by vapor deposition to a thickness of 15 nm to form a multilayered film. Ten multilayered films were successively laminated with an adhesive to form a laminate, followed by heating at 50° C. for one hour under air atmosphere to carry out a heat treatment. The heat-treated laminate was adhered onto a brass sheet having a thickness of 10 mm so that the surface of the ferrite-dispersed epoxy resin film layer may be faced thereto to obtain an intended electromagnetic wave absorber having a thickness of about 1000 μm on the brass sheet.

EXAMPLE 5

A polyphenylene sulfide film having a thickness of 50 μm was subjected to electroless plating copper to be a thickness of 10 nm to form a multilayered film as one unit. Twelve units were successively laminated to form a laminate, followed by heating at 100° C. for one hour to be heat-treated. The heat-treated laminate was adhered onto a brass sheet having a thickness of 10 mm so that the surface of the polyphenylene sulfide film layer may be faced thereto to obtain an intended electromagnetic wave absorber having a thickness of about 600 μm on the brass sheet.

COMPARATIVE EXAMPLE

Into an epoxy resin solution was incorporated and dispersed 30 parts of barium-containing ferrite per 100 parts of the resin solid content to obtain a barium ferrite coating material, which was then coated and dried onto a brass sheet having a thickness of 10 mm to a dry film thickness of 900 μm to Obtain an electromagnetic wave absorber on the brass sheet.

Figure 2:
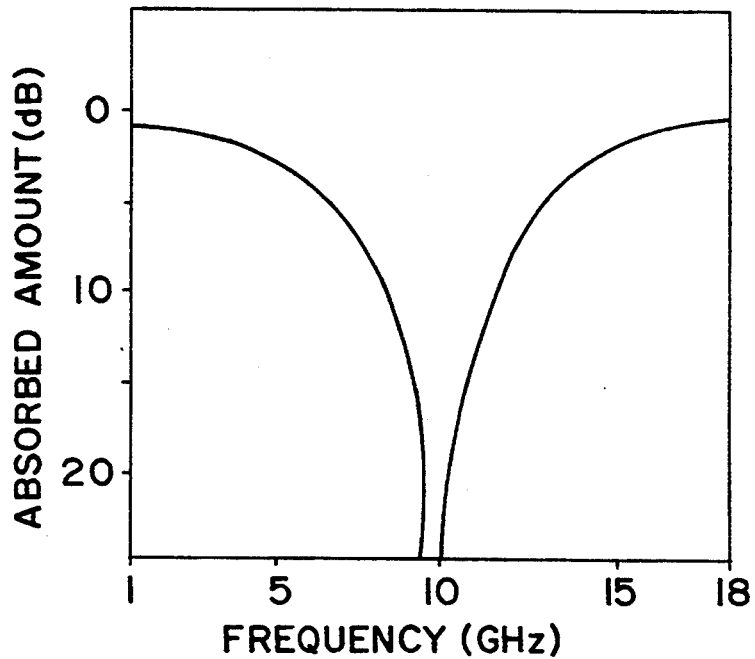
FIG. 2 shows a graph of an electromagnetic wave absorption curve of the electromagnetic wave absorber obtained in Example 2.
Figure 3:
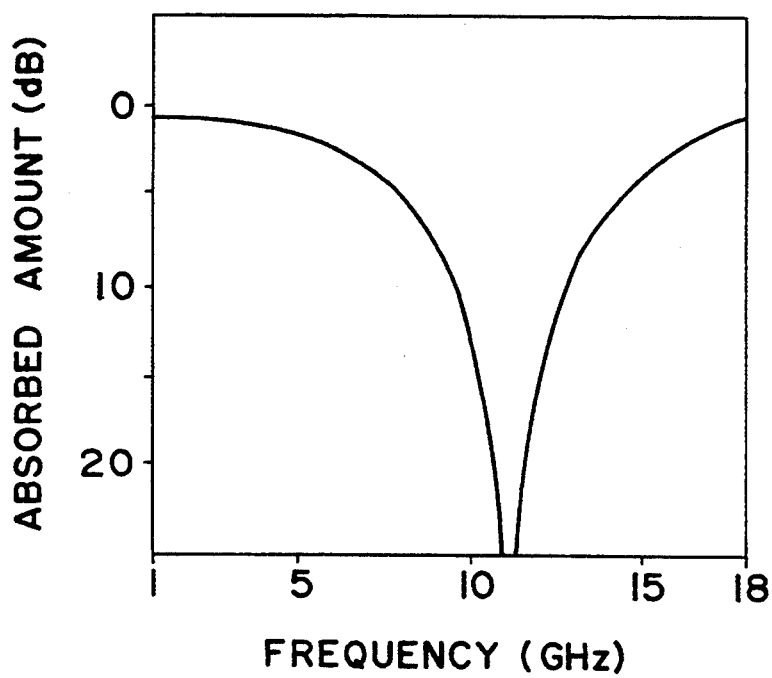
FIG. 3 shows a graph of an electromagnetic wave absorption curve of the electromagnetic wave absorber obtained in Example 3.
Figure 4:
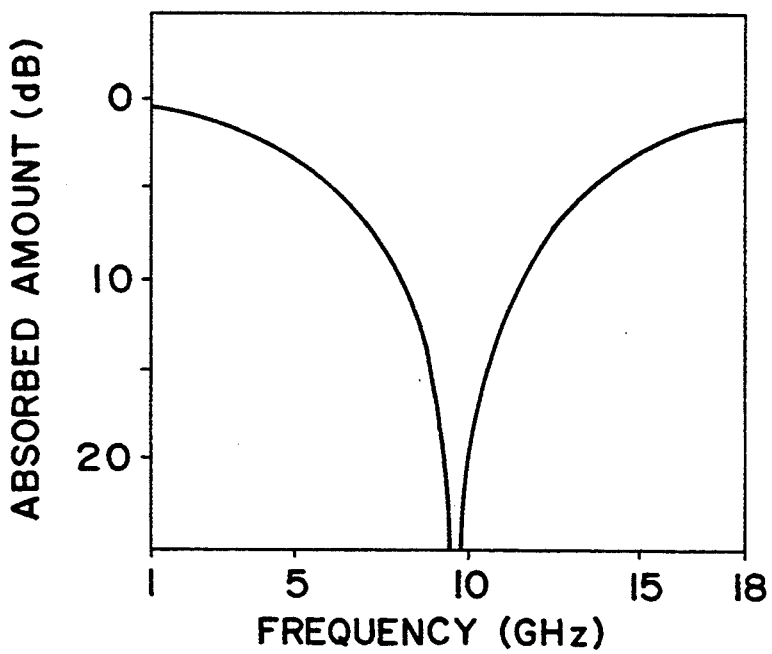
FIG. 4 shows a graph of an electromagnetic wave absorption curve of the electromagnetic wave absorber obtained in Example 4.
Figure 5:
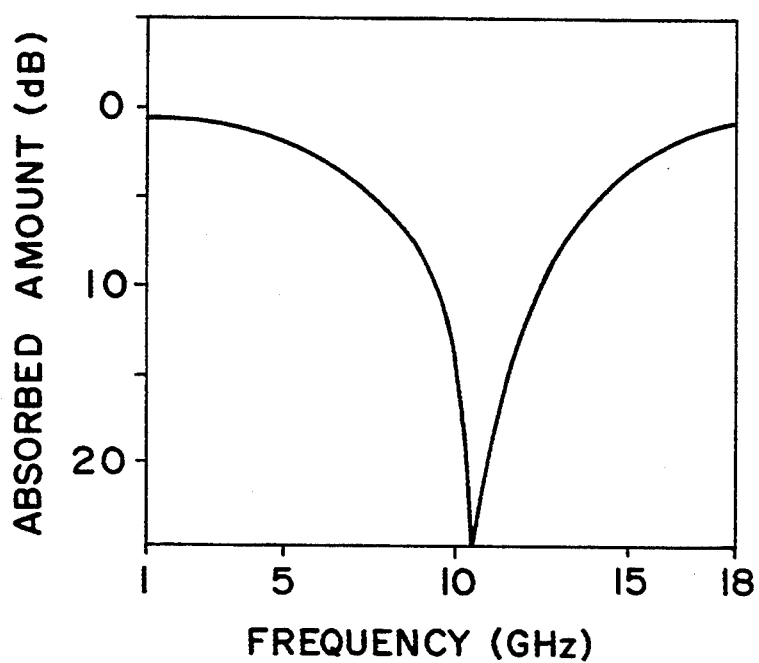
FIG. 5 shows a graph of an electromagnetic wave absorption curve of the electromagnetic wave absorber obtained in Example 5.

The electromagnetic wave absorption characteristics of the electromagnetic wave absorbers formed on the brass sheet in Examples 1–5 and Comparative Example 1 were determined in a frequency range of 1 to 18 GHz respectively. The results are shown in FIGS. 1 to 5.

What is claimed is:

1. An electromagnetic wave absorber comprising two or more multilayered films each consisting of a resin layer (A) composed of a resin or a resin containing a pigment and having a film thickness of 1 μm to 1 mm, and a layer (B) having a film thickness of 1 nm to 50 nm, wherein the layer (B) is applied onto the resin layer (A) and is selected from the group consisting of a metal layer and an alloy layer, the metal constituting the metal layer being selected from the group consisting of nickel, iron, copper and silver, and the alloy constituting the alloy layer being terbium-iron-cobalt alloy, said electromagnetic wave absorber being formed onto a base structure selected from the group consisting of (i) a metal structure, (ii) a metallic sheet and (iii) a plastic film laminated on a metallic sheet, and an uppermost clear or colored film layer on the layer (B) away from the layer (A).

2. The electromagnetic wave absorber as claimed in claim 1, wherein the film thickness of the layer (B) is 1 nm to 30 nm.

* * * * *